United States Patent
Michel et al.

(10) Patent No.: US 9,401,265 B2
(45) Date of Patent: Jul. 26, 2016

(54) METHOD AND DEVICE FOR POLARIZING A DBD ELECTRODE

(75) Inventors: Eric Michel, Jumet (BE); Eric Tixhon, Jumet (BE); Joseph Leclercq, Jumet (BE)

(73) Assignee: AGC Glass Europe, Brussels (BE)

( * ) Notice: Subject to any disclaimer, the term of this patent is extended or adjusted under 35 U.S.C. 154(b) by 538 days.

(21) Appl. No.: 13/511,163

(22) PCT Filed: Nov. 23, 2010

(86) PCT No.: PCT/EP2010/068049
§ 371 (c)(1),
(2), (4) Date: Jun. 28, 2012

(87) PCT Pub. No.: WO2011/064217
PCT Pub. Date: Jun. 3, 2011

(65) Prior Publication Data
US 2012/0258260 A1    Oct. 11, 2012

(30) Foreign Application Priority Data

Nov. 24, 2009 (EP) .................................... 09176940
Feb. 12, 2010 (EP) .................................... 10153448

(51) Int. Cl.
*C23C 16/00* (2006.01)
*H01J 37/32* (2006.01)
(Continued)

(52) U.S. Cl.
CPC ......... *H01J 37/32348* (2013.01); *C23C 16/507* (2013.01); *C23C 16/545* (2013.01);
(Continued)

(58) Field of Classification Search
CPC .................... H05H 1/2406; H05H 2001/2418; C23C 16/50; C23C 16/503; C23C 16/517; H01L 21/02274
See application file for complete search history.

(56) References Cited

U.S. PATENT DOCUMENTS 4,809,149 A    2/1989   Burghard
5,573,597 A *  11/1996  Lantsman .............. 118/723 MP
(Continued)

FOREIGN PATENT DOCUMENTS

CA    2 506 787    6/2004
EP    2 180 768    4/2010
(Continued)

OTHER PUBLICATIONS

International Search Report Issued Mar. 28, 2011 in PCT/EP10/68049 Filed Nov. 23, 2010.
(Continued)

*Primary Examiner* — David Turocy
(74) *Attorney, Agent, or Firm* — Oblon, McClelland, Maier & Neustadt, L.L.P.

(57) ABSTRACT

The invention relates to a device for treating the surface of a substrate by means of dielectric barrier discharge for generating a filamentary plasma, including a reaction chamber comprising a mixture having a composition such that, when in contact with the plasma, the mixture decomposes and generates species capable of deposition in the form of a layer mostly or totally on the substrate, wherein at least two electrodes area provided in said chamber, with one electrode being subjected to a high AC voltage, and are arranged on either side of the substrate, at least one dielectric barrier (DBD) arranged between said at least two electrodes, and a THT/HF transformer comprising a secondary circuit, in which a direct current (DC) power source is provided in series in the secondary circuit such that the chemical species generated in the plasma in the form of electrically positive or negative ions are selectively attracted by the target substrate inserted in the reaction chamber and arranged between said at least two electrodes, and repelled by electrodes having a corresponding charge.

22 Claims, 3 Drawing Sheets

(51) Int. Cl.
*C23C 16/54* (2006.01)
*C23C 16/507* (2006.01)
*H05H 1/24* (2006.01)
*C23C 16/50* (2006.01)

(52) U.S. Cl.
CPC .............. *H05H1/2406* (2013.01); *C23C 16/50* (2013.01); *H05H 2001/2412* (2013.01); *H05H 2242/1005* (2013.01)

(56) References Cited

U.S. PATENT DOCUMENTS

| | | | |
|---|---|---|---|
| 5,807,470 A | 9/1998 | Szczyrbowski et al. | |
| 5,895,558 A | 4/1999 | Spence | |
| 6,059,935 A | 5/2000 | Spence | |
| 6,299,948 B1* | 10/2001 | Gherardi et al. | 427/569 |
| 6,416,633 B1 | 7/2002 | Spence | |
| 6,489,585 B1* | 12/2002 | Nakamura | H01J 37/32009 219/121.48 |
| 6,827,870 B1* | 12/2004 | Gianchandani et al. | 216/71 |
| 8,470,095 B2* | 6/2013 | Tixhon et al. | 134/1.1 |
| 8,753,723 B2* | 6/2014 | Tixhon et al. | 427/569 |
| 2003/0022519 A1* | 1/2003 | Fujioka et al. | 438/758 |
| 2007/0176709 A1* | 8/2007 | Oksuz et al. | 333/109 |
| 2008/0317974 A1* | 12/2008 | de Vries et al. | 427/569 |

FOREIGN PATENT DOCUMENTS

| | | |
|---|---|---|
| JP | 62-293964 | 12/1987 |
| JP | 07-85997 | 3/1995 |
| JP | 07-155529 | 6/1995 |
| JP | 09-111449 | 4/1997 |
| JP | 2003-003268 | 1/2003 |
| JP | 2003-523053 | 7/2003 |
| WO | WO 01/59809 A1 | 8/2001 |
| WO | WO 2010047593 A1 * | 4/2010 |

OTHER PUBLICATIONS

Japanese Office Action issued in Japanese Patent Application No. 2012-540404 mailed Oct. 6, 2014 (w/English translation).

* cited by examiner

METHOD AND DEVICE FOR POLARIZING A DBD ELECTRODE

The invention relates to a method for the deposition of films onto an inorganic substrate in order to modify its properties. In particular, the aim of the invention is the deposition of films onto glass plates. In the context of the invention, the surface treatment of a substrate and the deposition of films onto a substrate have an identical meaning.

The invention also relates to an installation allowing the method in question to be applied, notably continuously.

Various methods are used to deposit coatings as thin films onto various types of substrates. They are differentiated notably by the way in which the energy is generated for the production and/or the bonding to the medium of the desired compounds.

The deposition of coatings as thin films forms a part of many different applications, such as electronics, anti-corrosion and tribological coatings, such as refractory layers (nitrides, carbides and oxides of titanium or aluminum), coatings with optical properties (anti-reflective, sun-shield, filters, etc.), coatings providing other special surface properties (anti-microbial, self-cleaning, hydrophilic, hydrophobic, etc.), conducting layers of tin oxide for various applications (photovoltaic, LED, OLED, organic photovoltaic, etc.).

The substrates concerned can be of various different types: glass, steel, ceramic, organic polymers, thermoplastics, etc.

There are four main techniques for deposition of thin films applicable, in particular, in the glass industry: sol-gel, magnetron, pyrolytic spray, and chemical vapor deposition (CVD).

CVD consists in projecting onto a hot substrate chemically reactive species or precursors, previously vaporized, which decompose by pyrolysis upon contact with the hot substrate.

This method is commonly applied "on-line" during the production of float glass. Thin films (of the order of a few tens or hundreds of nm), notably of oxides, are thus obtained. The layers obtained are dense, of high purity and chemically and also mechanically generally very stable. The deposition rates are high.

However, the range of materials able to be deposited is limited since it is difficult to find precursors that are volatile enough and that will pyrolyze in the range of temperatures accessible to glass-makers (500-750° C.). One possibility for overcoming the problem of temperature of the substrate, and hence for extending the range of the precursors usable in CVD and, consequently, the range of materials that can be deposited, is to combine conventional CVD (possibly at lower temperature) with a plasma device.

PECVD (for "Plasma Enhanced Chemical Vapor Deposition") can be carried out by means of any type of plasma: cold plasmas (non-equilibrium) or thermal plasmas (in equilibrium). Cold plasmas are generally preferred. The active species of the plasma (electrons, ions, metastable, etc.) typically possess energies of several electron-volts (eV) and can thus cause the dissociation or the activation of the chemical precursors.

In order to keep the plasma from reaching equilibrium, it is often necessary to operate at low pressure. The majority of the PECVD techniques known therefore use low-pressure plasmas. However, in order to apply this method on the industrial scale, the costs will need to be minimized. There is therefore a growing interest on the part of industrialists in transferring the low-pressure plasma technologies to plasma technologies operating in a pressure range close to atmospheric pressure.

Various different regimes are furthermore to be distinguished in plasma deposition processes: the uniform plasma regime (using 'glow-discharge plasmas'). This allows very uniform depositions and requires a relatively low level of energy. In contrast, it is slower, it needs to be limited to a tighter frequency range in order to remain stable and it limits the composition of the species that can be deposited.

If the energy of the plasma is increased, there is a risk of causing the appearance of electric arcs. The interposition of a dielectric between the electrodes allows an intermediate regime between the "glow discharge" and the apparition of arcs to be maintained: this is referred to as a "filamentary" regime. The "filaments", which are highly unstable, carry a high energy and therefore allow the processing time to be reduced accordingly, in other words the passage of the substrate to be accelerated. Furthermore, because of the very random action of the filaments, paradoxically a very uniform distribution rate of the deposited materials is obtained. The implementation of these two technologies has been widely described in publications and hence is known to those skilled in the art.

The aim is to combine the potentialities of the conventional CVD processing methods with the potentialities of an atmospheric pressure plasma process. The choice of the Applicant has been to use a dielectric barrier discharge (DBD). The latter indeed offers the advantage, with respect to the other plasma processes, of operating both at low pressure and at atmospheric pressure and of allowing a continuous coating process over large surface areas, which implies that wattage powers of the order of the MegaWatt can be developed.

During the formation of the deposit by the DBD method, it is observed that the deposition is symmetrical, in other words that the quantity of material deposited onto the substrate and onto the electrode is the same per unit time.

The deposition onto the electrode is unwanted and constitutes a significant drawback for the exploitation of this method in high-capacity industrial applications, because it quickly begins to affect the quality of the layer deposited onto the target substrate by the modification of the inter-electrode spacing which constitutes an essential parameter for guaranteeing the formation of a uniform layer.

Frequent cleaning would therefore be indispensable, leading to losses of productivity, together with a redundancy of the layer deposition installations in continuous production processes in order to allow alternate cleaning operations.

However, it is observed that the chemical species formed in the plasma are notably in the form of positive and negative ions. This is equivalent to saying that the chemical species involved in the process of formation of the layer on the material to be coated are not electrically neutral.

A first aim of the invention is to reduce, or even eliminate, the unwanted deposits on the high-voltage electrode by polarizing the latter.

Another aim is to improve the efficiency of film deposition processes by increasing the voltage on the alternation cycle during which the desired species are deposited onto a substrate.

A first subject of the invention is a method for the deposition of a layer onto an inorganic substrate characterized in that it comprises the following operations:

introduce or pass a substrate in a process chamber in which at least two electrodes are placed positioned on either side of the substrate, at least one dielectric barrier being placed between these at least two electrodes;

turn on a power supply stabilized in amplitude and in frequency comprising a very high voltage (VHV) and high frequency (HF) transformer comprising a secondary circuit whose terminals have at least two electrodes connected to them;

generate in the secondary circuit of this transformer a stabilized electrical voltage at high frequency of value such that it leads to the generation of a filamentary plasma in the process chamber, between the at least two electrodes, the plasma being composed of electrons, of neutral species, of positive and negative ions, of species in the stable and excited state;

turn on a supply of DC current placed in series with the VHV/HF transformer for generating a DC voltage which is superimposed on the AC voltage generated by the transformer, so as to increase the polarity of the substrate and to decrease the polarity of the electrode or vice versa depending on the value of the AC voltage;

introduce into the process chamber a mixture whose composition is such that, upon contact with the plasma, it decomposes and generates species able to be deposited as a film mostly or totally onto the substrate;

maintain the substrate in the chamber over a lapse of time long enough to obtain on at least one of its faces a layer with a desired thickness.

It will be noted that the method of the invention is defined in terms of "operations" rather than "steps", in other words the succession of the operations is not necessarily carried out in the order that they are presented hereinabove.

The process chamber can be a closed system, such as implemented in a process referred to as "off-line", or open system, such as a process referred to as "on-line" for the in-line deposition of layers onto a substrate for example glass.

Typically, voltages are in the range between 1 and 50 kV.

Usually, the mixture introduced into the process chamber comprises, without however being limited to, gaseous organo-metallic precursors containing Ti, Si, Zr, Sn and Al, or a mixture of these, capable of forming species able to be deposited so as to form metal or metal oxide layers on the substrate. The mixture may also contain other substances, such as vector gases, oxidants, water, metal oxides dopants containing Sn, F, In, etc., in proportions known to those skilled in the art that they will employ according to the deposition technology.

The lapses of time are generally in the range between 1 s and 1 minute, preferably between 10 s and 50 s. The layer thicknesses obtained are also variable, typically in the range between a few nanometers and a few hundreds of nanometers, typically between 1 nm and 1000 nm.

The method furthermore comprises the operation consisting in adjusting the value of the DC source in such a manner that the AC voltage does not reach the value for plasma initiation in one of the polarity directions.

Another subject of the invention is a device for surface coating of a substrate by dielectric barrier discharge allowing the generation of a filamentary plasma comprising a process chamber comprising a mixture whose composition is such that upon contact with the plasma it decomposes and generates species able to be deposited as a film mostly or totally onto the substrate, in which chamber at least two electrodes are placed, to one of which the high AC voltage is applied, disposed on either side of the substrate, at least one dielectric barrier (DBD) placed between these at least two electrodes, and a VHV/HF transformer comprising a secondary circuit, in which a source of DC current is inserted in series in the secondary circuit, in such a manner that chemical species generated in the plasma in the form of electrically positive or negative ions are selectively attracted by the target substrate, which is introduced into the process chamber and placed between the at least two electrodes, and repelled by the electrodes with a corresponding charge.

The disposition in series of the source of DC current with the secondary circuit of the transformer means that the presence of inductances blocking the AC voltage is avoided. This notably offers the advantage of simplifying the electrical circuit and hence of reducing the costs of implementation on the industrial scale.

The DC source inserted in series in the secondary circuit of the VHV/HF transformer, whose DC voltages are preferably in the range between 1 kV and 15 kV, allows the unwanted deposition on the electrode to be reduced by 3% to 7%. According to an advantageous configuration, the DC voltages generated by the DC source are in the range between 15.1 kV and 100 kV, allowing a reduction in the unwanted deposition on the electrode of at least 7%.

By way of particular examples, values of DC voltages in the range between 20 and 100 kV, more preferably between 20 and 80 kV, give reductions in unwanted depositions of at least 15%, in particular of at least 35%. Specifically, for voltages of 20, 40, 60, 80 kV, reductions in depositions of 15%, 25%, 30% and 35% are respectively obtained.

The process chamber can be a closed system, such as implemented in a process referred to as "off-line", or open, such as a process referred to as "on-line" for in-line deposition of layers onto glass for example. The substrate can therefore pass through the process chamber or be placed within it.

According to an advantageous embodiment, the DC source is obtained by means of a rectifier circuit supplied directly by a fraction of the HF voltage taken from the VHV/HF generator.

The device preferably comprises a switch allowing the positive and negative poles to be permutated in order to polarize the electrode either positively or negatively with respect to the target substrate.

Means of adjustment of the polarization voltage are advantageously provided, such as potentiometers, in such a manner that said voltage only allows the plasma to strike on a positive or negative half-cycle, the polarization being such that the plasma generates the species chemically responsible for the film deposition only when the electrode has the opposite sign to these said species.

The poles of the DC source are advantageously short-circuited by a capacitor whose impedance is at least 1000 times smaller than that formed by the discharge cell, the latter having a typical value of a few hundred pF.

Advantageously, the device comprises a blocking capacitor placed directly in series with the transformer in order to avoid the DC component of the current interfering with the operation of this VHV/HF transformer. Such blocking capacitors usually have values of a few µF.

A first advantage of the method and of the device of the invention is that the decrease, or even the elimination, of unwanted deposits on the high-voltage electrode does not generate interference in the discharge plasma, such as the modifications of the dielectric constants and of the inter-electrode spacing, and that it is no longer necessary to interrupt the process in order to carry out cleaning of the electrode.

Another advantage of the method of the invention is that the polarization of the high-voltage electrode allows an excess of voltage on the alternation cycle during which the film deposition takes place on the substrate. This additional voltage allows, for a given inter-electrode distance, the material efficiency to be increased together with the deposition rates. It also allows, for a given deposition rate or material efficiency, the gap that separates the electrodes to be increased.

The device and the method of the invention are very advantageously adapted to organic and/or inorganic layer depositions, such as metals, metal oxides and polymers, onto a substrate, such as float glass, in other words applied "on-line" during float glass production, as mentioned above.

The invention also relates to the use of a device for surface coating of a substrate by dielectric barrier discharge, allowing the generation of a filamentary plasma, comprising a process chamber comprising a mixture whose composition is such that upon contact with the plasma it decomposes and generates species able to be deposited as a film mostly or totally onto the substrate, chamber in which at least two electrodes are placed, to one of which the high AC voltage is applied, disposed on either side of the substrate, at least one dielectric barrier (DBD) placed between these at least two electrodes, and a VHV/HF transformer comprising a secondary circuit, in which a source of DC current is inserted in series in the secondary circuit, for reducing or eliminating the unwanted deposits on the electrode to which the high AC voltage is applied.

Very advantageously, the DC voltages from the DC source are in the range between 20 and 100 kV, more preferably between 20 and 80 kV, leading to reductions in unwanted deposits of at least 15%, in particular of at least 35%.

The invention furthermore relates to the use of a device for surface coating of a substrate by dielectric barrier discharge, allowing the generation of a filamentary plasma, comprising a process chamber comprising a mixture whose composition is such that upon contact with the plasma it decomposes and generates species able to be deposited as a film mostly or totally onto the substrate, chamber in which at least two electrodes are placed, to one of which the high AC voltage is applied, disposed on either side of the substrate, at least one dielectric barrier (DBD) placed between these at least two electrodes, and a VHV/HF transformer comprising a secondary circuit, in which a source of DC current is inserted in series in the secondary circuit, for improving the efficiency of film deposition processes by increasing the voltage on the alternation cycle during which the desired species are deposited onto the substrate.

The preferred features of the device defined hereinabove are also applicable here in the framework of the use of said device.

These aspects together with other aspects of the invention are described in more detail hereinbelow, reference being made to the drawings in the figures, in which.

The figures are not drawn to scale. Generally, similar elements are denoted by similar references in the figures.

The invention relates to a method and a device for polarization in DC current of a cell of a dielectric barrier discharge (DBD) device allowing any unwanted deposition onto one of the electrodes of this cell to be reduced or eliminated, for example by at least 15%, in particular by at least 35%, for voltages in the range between 20 and 100 kV. The electrode is used for the generation of the plasma producing chemical species in the form of electrically positive or negative ions forming a film by deposition onto a target substrate, which is, for example, a volume of glass.

This function can be improved by DC polarization of the electrode, which allows any unwanted deposition onto said electrode to be reduced or eliminated. Indeed, the polarization of the high-voltage electrode allows the electrical charges of the same sign to be repelled and hence the formation of an unwanted deposit on this electrode to be reduced. Indeed, in this case, only the species, in general ionized molecules, with a sign opposite to that of the electrode are attracted by the latter and can be deposited onto it, which considerably slows the unwanted deposition.

Figure 3:
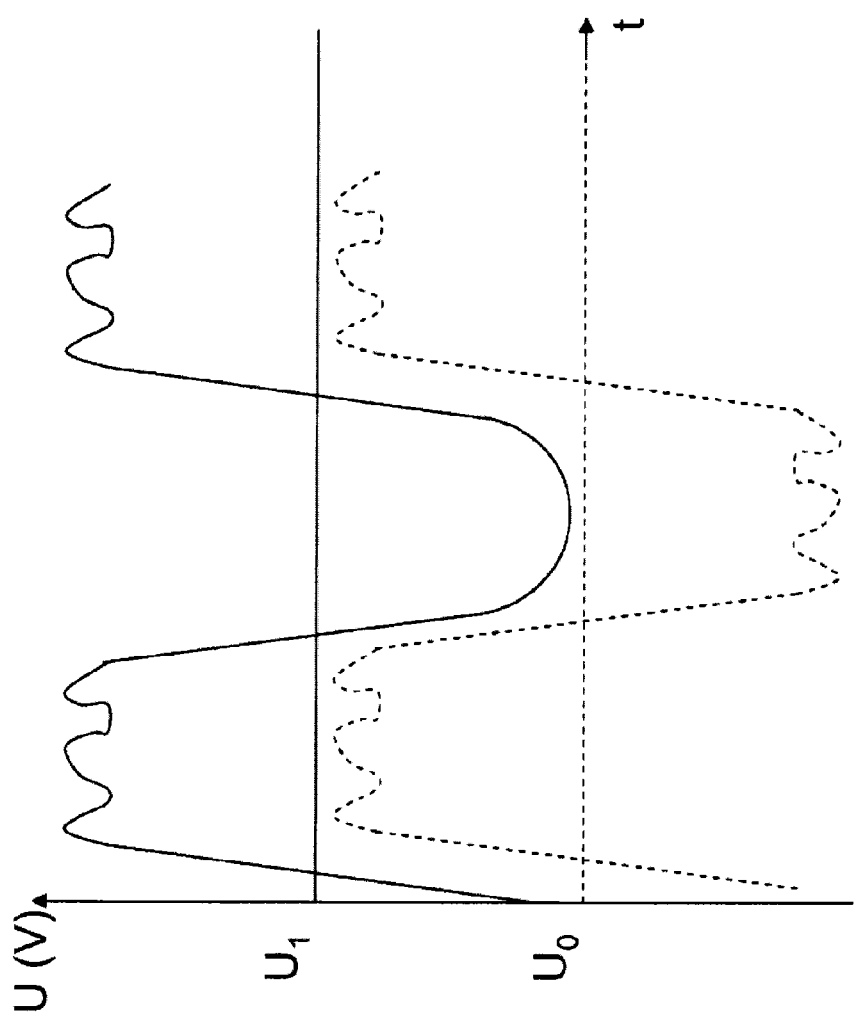
FIG. 3 is a graph showing the effect of superposition of the two DC and AC voltages.

As shown in FIG. 3, the polarization voltage can be adjusted in such a manner that it only allows the plasma to strike on one alternation half-cycle (positive or negative). This is made possible by applying a polarization such that the resulting voltage between the high-voltage electrode and ground is lower than the voltage for initiation of the plasma. It is then possible to avoid any deposition associated with the positive or negative alternation half-cycle. Since the chemical species responsible for the film deposition are no longer generated during the half-period during which they are attracted toward the electrode, the unwanted deposition is practically eliminated.

This polarization is obtained by inserting in series in the secondary circuit of the VHV/HF transformer a DC source preferably in the range between 1 kV and 15 kV and, according to an advantageous configuration, between 15.1 kV and 100 kV. By way of particular examples, values of DC voltages in the range between 20 and 100 kV, more preferably between 20 and 80 kV, yield reductions in unwanted deposits of at least 15%, in particular of at least 35%. Specifically, for voltages of 20, 40, 60, 80 kV, reductions of 15%, 25%, 30% and 35% are respectively obtained.

Figure 1:
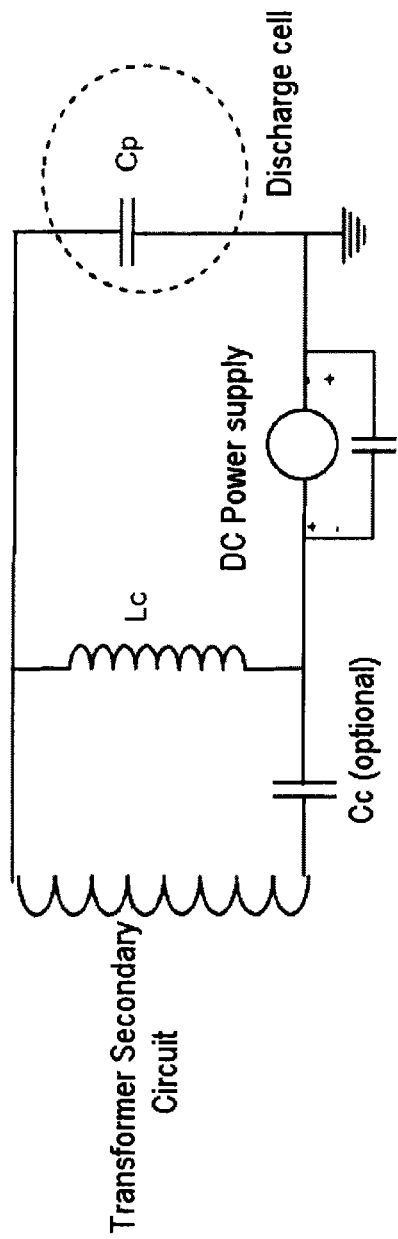
FIG. 1 is a simplified diagram of a series mode of polarization.

More precisely, the DC source is inserted between ground, common with the earth connection, and the "cold" junction of the secondary circuit of the high-voltage transformer and of the compensation inductor, as shown in FIG. 1. In certain situations, in order to avoid the DC component interfering with the operation of the high-voltage VHV/HF transformer by causing the magnetic saturation of its ferrite core, it is advantageous to insert a blocking capacitor Cc placed directly in series with the transformer.

The DC source has floating poles for allowing, depending on the various types of film, a positive or negative polarization. The positive and negative poles can be switched in order to polarize the electrode either positively or negatively with respect to the target substrate. The poles of the DC source are shunted by a capacitor whose impedance is at least 1000 times smaller than the capacitance of the discharge cell, which is in fact the electrical equivalent of the plasma chamber where the surface coating operations take place. The capacitor in parallel with the DC power supply has a value such that its impedance is much less than that of the discharge cell so as not to affect the operation of the resonant circuit formed by the coupling between the capacitive part of the system (Cp) and the inductive part of the compensation inductors (Lc).

Figure 2:
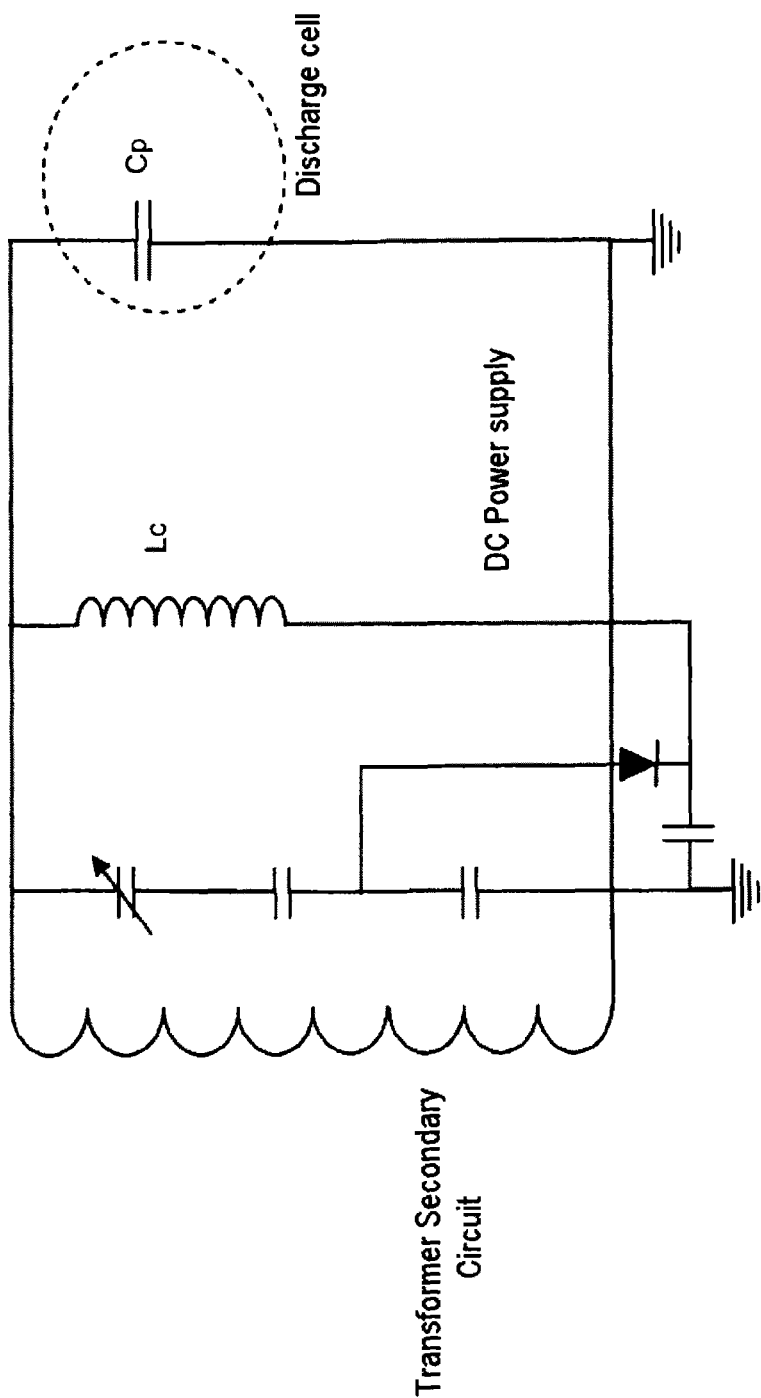
FIG. 2 is a simplified diagram of a mode of polarization with voltage tapping on the secondary of the transformer and rectification.

In the case of high-power installations, needed for high production throughputs, it can be advantageous to generate the polarization DC voltage by taking a fraction of the high-frequency voltage. As is shown in FIG. 2, the DC source is obtained by means of a rectifier circuit supplied directly by a fraction of the VHV/HF voltage taken from the VHV/HF generator.

It will seem obvious to those skilled in the art that the present invention is not limited to the examples illustrated and described hereinabove. The invention comprises each of the novel features and includes their combination. The presence of reference numbers cannot be considered as being limiting. The employment of the term "comprises" cannot in any way exclude the presence of elements others than those mentioned. The employment of the indefinite article "a" for introducing an element does not exclude the presence of a plurality of these elements. The present invention has been described with reference to specific embodiments, which have a value that is purely illustrative and should not be considered as limiting.

The invention claimed is:

1. A method for depositing a film on an inorganic substrate, the method comprising:
    providing a power supply stabilized in amplitude and in frequency, the power supply comprising a transformer having a secondary circuit comprising secondary terminals connected to two plasma-generating electrodes;
    introducing or passing a substrate in a process chamber with said two plasma-generating electrodes on either side of the substrate and with a dielectric barrier between the two plasma-generating electrodes such that the substrate is passed in between the two plasma-generating electrodes connected to the secondary terminals;
    coupling power from the transformer via said secondary terminals to the two plasma-generating electrodes inside the process chamber;
    generating, in the secondary circuit of the transformer, a stabilized electrical AC voltage, and thereby generating a filamentary plasma in the process chamber in between the two plasma-generating electrodes, the plasma comprising electrons, neutral species, positive and negative ions, species in a stable and an excited state, or a combination thereof;
    supplying DC current in series with the transformer by a DC supply, thereby generating a DC voltage superimposed on the AC voltage, and increasing a polarity of the substrate and decreasing a polarity of an electrode, or vice versa, depending on a value of the AC voltage;
    introducing into the process chamber a mixture with a composition such that, upon contact with the plasma, the mixture decomposes and generates species able to be deposited as a film onto the substrate; and
    maintaining the substrate in the chamber for a time sufficient to obtain a layer with a desired thickness on a face of the substrate.

2. The method of claim 1, further comprising:
    adjusting a value of the DC voltage such that the AC voltage does not reach a plasma initiation value in a polarity direction.

3. The method of claim 1, further comprising inverting a polarity of the DC voltage with respect to the substrate.

4. The method of claim 1,
    wherein the DC voltage is between 20 and 100 kV, thereby reducing unwanted deposits by at least 15%.

5. The method of claim 4, wherein the DC voltage is between 20 and 80 kV.

6. The method of claim 4,
    wherein the DC voltage is between 20 and 60 kV.

7. The method of claim 4,
    wherein the DC voltage is between 20 and 100 kV, thereby reducing unwanted deposits by at least 35%.

8. The method of claim 1,
    wherein the mixture deposits a film mostly or totally on the substrate.

9. The method of claim 1, wherein the transformer comprises a high voltage (VHV) transformer capable of a voltage between 15.1 and 100 kV.

10. The method of claim 1, wherein said supplying DC current in series comprises superimposing for the DC voltage a voltage between 15.1 kV and 100 kV.

11. The method of claim 1, wherein said maintaining the substrate in the chamber comprises maintaining the chamber in a pressure range close to atmospheric pressure.

12. The method of claim 1, wherein supplying DC current comprises supplying DC current in series with a cold side of the transformer.

13. The method of claim 1, wherein supplying DC current comprises supplying DC current from a DC source having floating poles permitting a positive or negative polarization to be supplied to one of the two electrodes.

14. The method of claim 1, wherein supplying the DC current in series with the transformer comprises supplying a DC current by a DC supply disposed between ground and an inductor connecting to a powered electrode of the two electrodes.

15. The method of claim 1, further comprising using the DC voltage superimposed on the AC voltage to reduce or suppress deposition of the species on at least one of the two electrodes connected to the secondary terminals.

16. A method for depositing a film, comprising:
    coupling power from a transformer via secondary terminals of the transformer to two plasma-generating electrodes disposed inside the process chamber;
    introducing or passing a substrate between the two plasma-generating electrodes disposed inside a process chamber and having a dielectric barrier between the two plasma-generating electrodes connected to the secondary terminals of the transformer;
    generating, in a secondary circuit of the transformer, an electrical AC voltage;
    generating a filamentary plasma in the process chamber, between the two plasma-generating electrodes;
    supplying DC current in series with the transformer to at least one of the two electrodes by a DC supply;
    introducing into the process chamber a mixture with a composition such that, upon contact with the plasma, the mixture decomposes and generates species to be deposited as a film onto the substrate; and
    maintaining the substrate in the chamber to obtain a layer on the substrate.

17. The method of claim 16, wherein the transformer comprises a high voltage (VHV) transformer capable of a voltage between 20 and 100 kV.

18. The method of claim 16, wherein said maintaining the substrate in the chamber comprises maintaining the chamber in a pressure range close to atmospheric pressure.

19. The method of claim 16, wherein supplying DC current comprises supplying DC current in series with a cold side of the transformer.

20. The method of claim 16, wherein supplying DC current comprises supplying DC current from a DC source having floating poles permitting a positive or negative polarization to be supplied to one of the two electrodes.

21. The method of claim 16, wherein supplying the DC current in series with the transformer comprises supplying a DC current by a DC supply disposed between ground and an inductor connecting to a powered electrode of the two electrodes.

22. The method of claim 16, further comprising using the DC voltage superimposed on the AC voltage to reduce or suppress deposition of the species on at least one of the two electrodes connected to the secondary terminals.

* * * * *